United States Patent
Wong et al.

(10) Patent No.: US 8,378,493 B2
(45) Date of Patent: Feb. 19, 2013

(54) GENERATION OF METAL HOLES BY VIA MUTATION

(75) Inventors: Robert C. Wong, Poughkeepsie, NY (US); Ernst H. Demm, Putnam Valley, NY (US); Pak Leung, Cedar Park, TX (US); Alexander M. Hirsch, Munich (DE)

(73) Assignees: Infineon Technologies AG, Munich (DE); International Business Machines Corporation, Armonk, NY (US); United Mircroelectronics Co., Hsin-chu (TW)

( * ) Notice: Subject to any disclaimer, the term of this patent is extended or adjusted under 35 U.S.C. 154(b) by 84 days.

(21) Appl. No.: 12/966,763

(22) Filed: Dec. 13, 2010

(65) Prior Publication Data

US 2011/0079921 A1 Apr. 7, 2011

Related U.S. Application Data

(62) Division of application No. 11/653,598, filed on Jan. 16, 2007, now Pat. No. 7,875,544, which is a division of application No. 10/703,100, filed on Nov. 6, 2003, now Pat. No. 7,188,321.

(51) Int. Cl.
*H01L 23/48* (2006.01)

(52) U.S. Cl. ............... 257/773; 257/774; 257/E23.011; 257/E23.145

(58) Field of Classification Search .......... 257/734, 257/773, 774, E23.011, E23.142, E23.145; 438/598, 665, 666, 667, 672, 675, 674

See application file for complete search history.

(56) References Cited

U.S. PATENT DOCUMENTS

| | | | |
|---|---|---|---|
| 5,446,311 A | 8/1995 | Ewen et al. | |
| 5,757,077 A | 5/1998 | Chung et al. | |
| 5,760,429 A * | 6/1998 | Yano et al. | 257/211 |
| 5,763,955 A | 6/1998 | Findley et al. | |
| 5,798,937 A * | 8/1998 | Bracha et al. | 716/54 |
| 6,037,649 A | 3/2000 | Liou | |
| 6,100,589 A | 8/2000 | Tanaka | |
| 6,222,136 B1 | 4/2001 | Appelt et al. | |
| 6,910,266 B2 | 6/2005 | Lee et al. | |
| 7,163,883 B2 | 1/2007 | Agarwala et al. | |
| 2001/0030368 A1 | 10/2001 | Tasaka | |
| 2003/0229866 A1 | 12/2003 | Allen et al. | |
| 2004/0063228 A1 | 4/2004 | Li et al. | |

FOREIGN PATENT DOCUMENTS

WO    WO 03/079240    3/2003

OTHER PUBLICATIONS

Stine, B.E. et al., "*The Physical and Electrical Effects of Metal-Fill Patterning Practices for Oxide Chemical-Mechanical Polishing Processes*," IEEE Transaction on Electron Devices, vol. 45, No. 3, Mar. 1998, pp. 665-679.

Kahng, A.B., "*Filling Algorithms and Analyses for Layout Density Control, IEEE Transactions on Computer-Aided Design of Integrated Circuits and System*", vol. 18, No. 4, Apr. 1999, pp. 445-462.

* cited by examiner

*Primary Examiner* — Khiem D Nguyen

(57) ABSTRACT

A semiconductor interconnect architecture provides a reduction in the intersection of vias on the last layer ("VL") and holes in the last thin metal layer ("MLHOLE") without degradation of the product yield or robustness, or increases copper dishing. The mutation of some dense redundant VLs to MLHOLEs decreases the number of intersections between VLs and MLHOLEs.

8 Claims, 6 Drawing Sheets

|  | Mutation as in FIGURE 2 | Mutation as in FIGURE 3 |
|---|---|---|
| New MLHOLEs generated | 225 | 144 |
| Remaining VLs | 675 | 756 |
| New VL#/Old VL# | 75% | 84% |
| New VL area/Old VL area | 100% | 99.2% |
| New hole local density | | |
| w/hole expanded to $0.8 \times 0.8\ \mu m^2$ | 25.8% | 16.6% |
| w/no expansion at $0.4 \times 0.4\ \mu m^2$ | 6.5% | 4.1% |

Figure 4

GENERATION OF METAL HOLES BY VIA MUTATION

PRIORITY CLAIM

This application is a divisional application of U.S. patent application Ser. No. 11/653,598, filed Jan. 16, 2007, now issued as U.S. Pat. No. 7,875,544, which is a divisional application of U.S. patent application Ser. No. 10/703,100, filed Nov. 6, 2003, and now issued as U.S. Pat. No. 7,188,321, the contents of each of which are incorporated herein by reference.

BACKGROUND

1. Technical Field

The invention relates generally to semiconductor manufacturing and, more particularly, to the generation of metal holes by via mutation.

2. Background Information

As geometries in the newer semiconductor technologies become smaller and smaller, it becomes increasingly important to build redundancy (vias and contacts) into the design layouts whenever possible. Redundant via/contact structures in the design can result in improved chip reliability. Dense redundant vias have been used to provide better product yield and more robust circuit operations. Additionally, in order to prevent copper dishing, metal holes are used over large metal shapes. So there are holes in at least one of the metal layers that are interconnected by the vias. However, metal holes generated over regions of dense redundant vias can intersect the vias, degrading the circuit conductivity and performance.

In some hardware, such as 130 nm CMOS technology, some metal holes over vias have caused chip failures. In particular, some vias in the last layer ("VL") have "punched through" the insulator below the metal holes ("MLHOLEs") of the last thin metal layer ("ML"), touching the signal lines (ML−1) below. An example of this is shown in FIG. 6, wherein via 61 may punch through MLHOLE and the insulator and short ML−1 to circuitry above via 61. In some testsites, most macros with VLs intersecting MLHOLEs are not yieldable.

There have been proposals to remove the VLs that intersect the MLHOLEs or to remove the MLHOLEs that intersect the VLs. However, in a metal region with dense redundant vias, almost all vias, except a few peripheral vias, intersect an MLHOLE. Therefore, removing the intersecting VLs can degrade the yield or make the product less robust. Removing the intersecting MLHOLEs can lead to copper dishing.

It is therefore desirable to provide a solution that reduces the intersection of VLs and MLHOLEs without degrading product yield or robustness or increasing copper dishing. Exemplary embodiments of the present invention can provide this by mutating some of the dense redundant VLs to MLHOLEs.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which:

FIG. 4 tabularizes the exemplary embodiments of FIGS. 2 and 3; and

DETAILED DESCRIPTION

While the making and using of various embodiments of the present invention are discussed herein in terms of specific configurations, sizes and spacing, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention can provide a reduction in the intersection of vias in the last layer ("VL") and holes in the last thin metal layer ("MLHOLE") without degrading product yield or robustness or increasing copper dishing. The mutation of some of the dense redundant VLs to MLHOLEs in conjunction with, in some exemplary embodiments, the expansion of some other VLs, can decrease the number of intersections between VLs and MLHOLEs. The VL expansion, as well as expansion of the new MLHOLEs, can be performed in accordance with a spacing rule between MLHOLE and VL. Although there is a reduction in the total number of VLs, the expanded VLs can still result in an increase in contact area. The expansion of the new MLHOLEs can permit a reduction in the percentage of VLs to be mutated.

An exemplary redundant via array can include 30×30 VLs (900 VLs), conventionally sized at 0.4×0.4 μm² each and spaced 0.4 μm apart. With a redundant via array conventionally configured in this manner, standard MLHOLEs of 0.4× 0.4 μm² cannot be placed within the array without at least touching the VLs at their corners. One way to generate standard-sized MLHOLEs that do not touch any VLs would be to mutate some VLs into MLHOLEs. The optimal percentage of VLs to be mutated can be based on the copper process. For example, for 130 nm CMOS technology with SiLK (Silicon insulation with Low K), the optimal percentage is about 20%.

Figure 1:
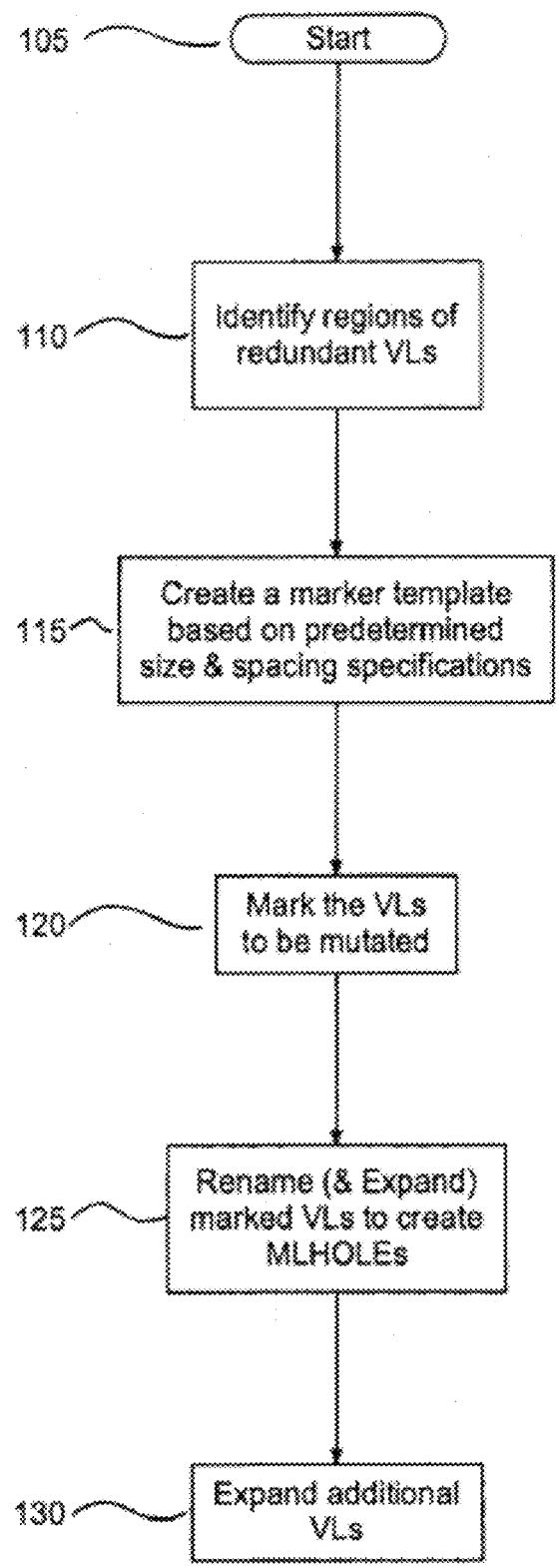
FIG. 1 illustrates an exemplary flow diagram for identifying and modifying redundant via arrays in accordance with the present invention.

FIG. 1 illustrates an exemplary flow diagram for identifying and modifying redundant via arrays in accordance with the present invention. Starting in block 105, regions of redundant via arrays can be identified in block 110. Redundant via arrays should have at least 2×2 VLs at close spacing (i.e., the distance between VLs would not allow the insertion of an MLHOLE without the MLHOLE intersecting a VL). Next, in block 115, a marker template can be created based on predetermined size and spacing specifications (e.g., VLs of 0.4×0.4 μm² and spaced 0.4 μm apart, MLHOLEs of 0.4×0.4 μm² and a 0.1 μm spacing rule). Using the marker template created in block 115, the VLs to be mutated can be marked in block 120. The marked VLs can then be renamed to create MLHOLEs in block 125 and, in some embodiments, these new MLHOLEs can be expanded. Additional VLs can be expanded as permitted by the spacing rule in block 130.

Figure 2:
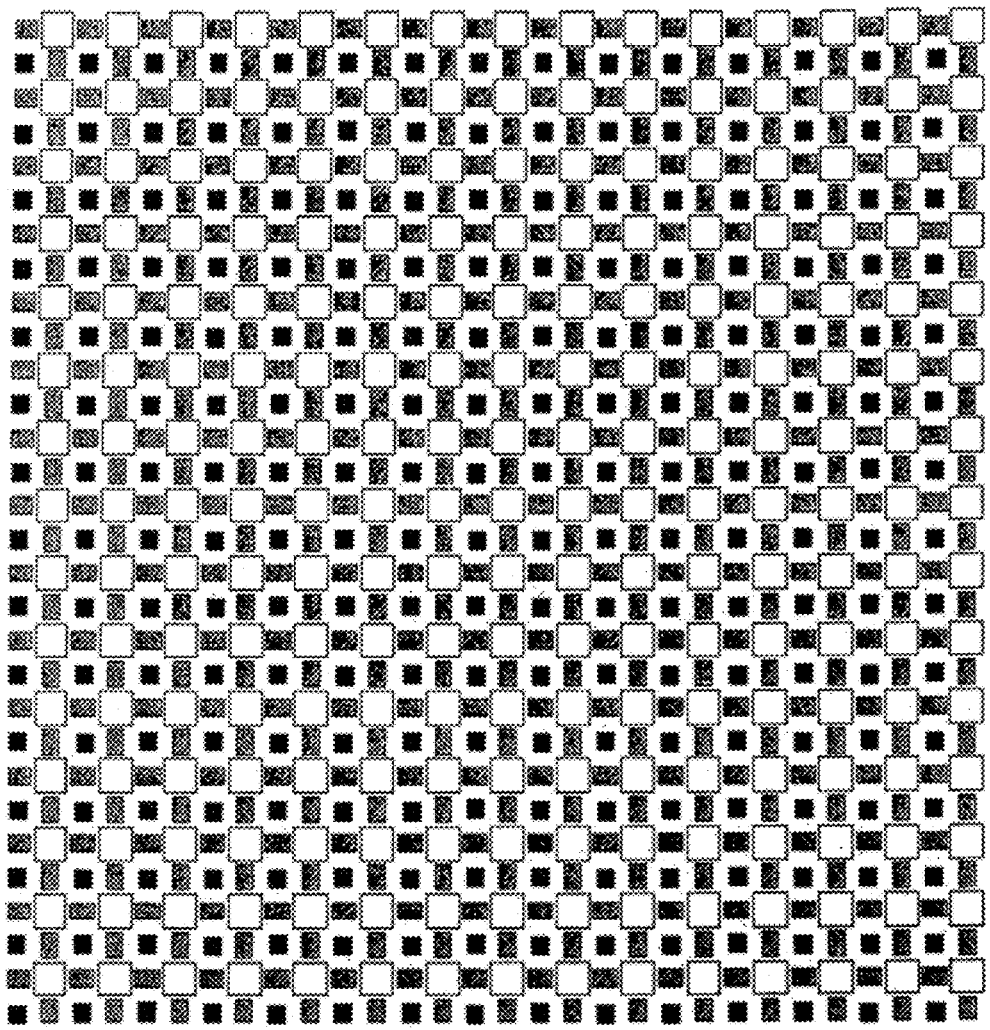
FIG. 2 diagrammatically illustrates exemplary embodiments of via mutation in accordance with the present invention.
Figure 3:
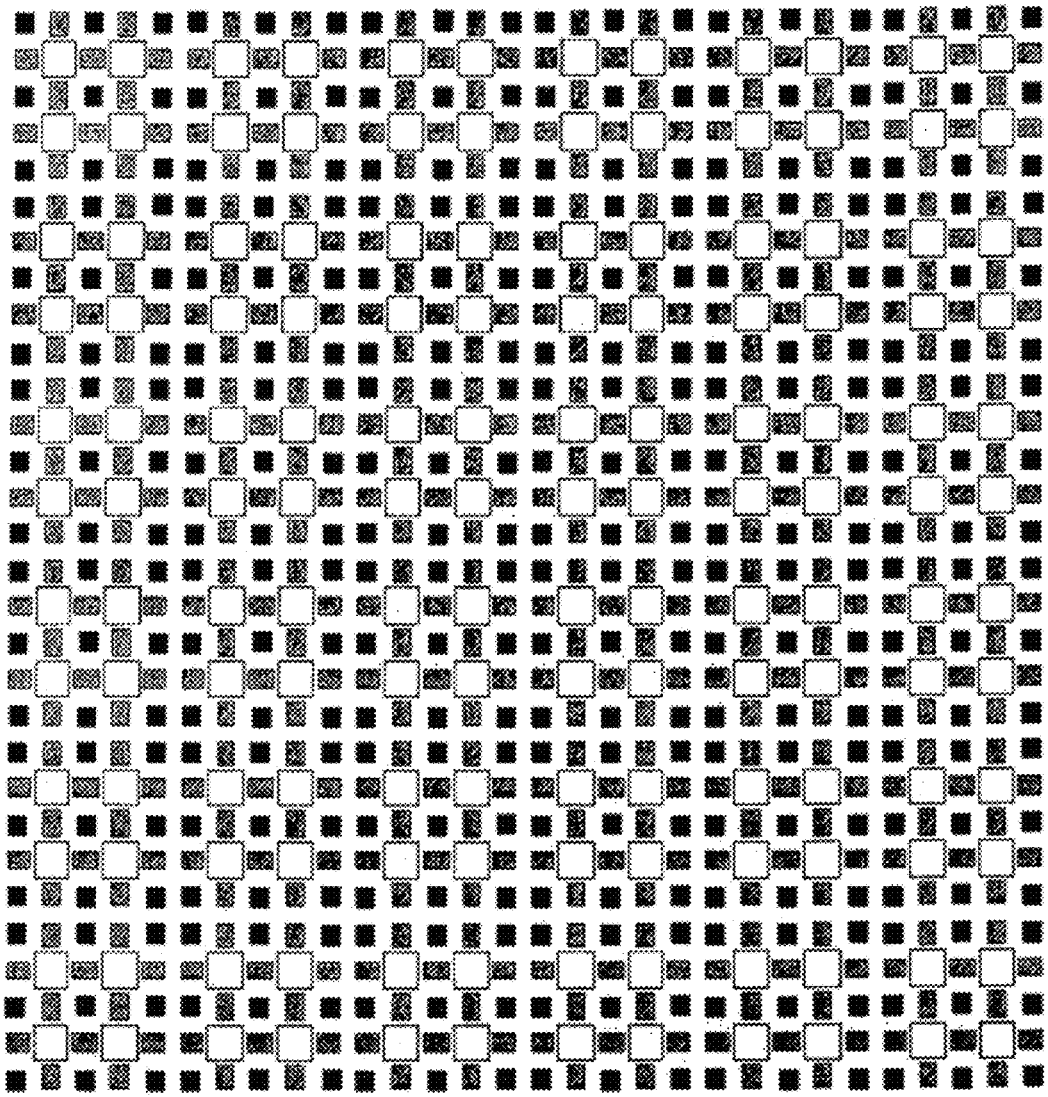
FIG. 3 diagrammatically illustrates exemplary embodiments of via mutation in accordance with the present invention.
Figure 5:
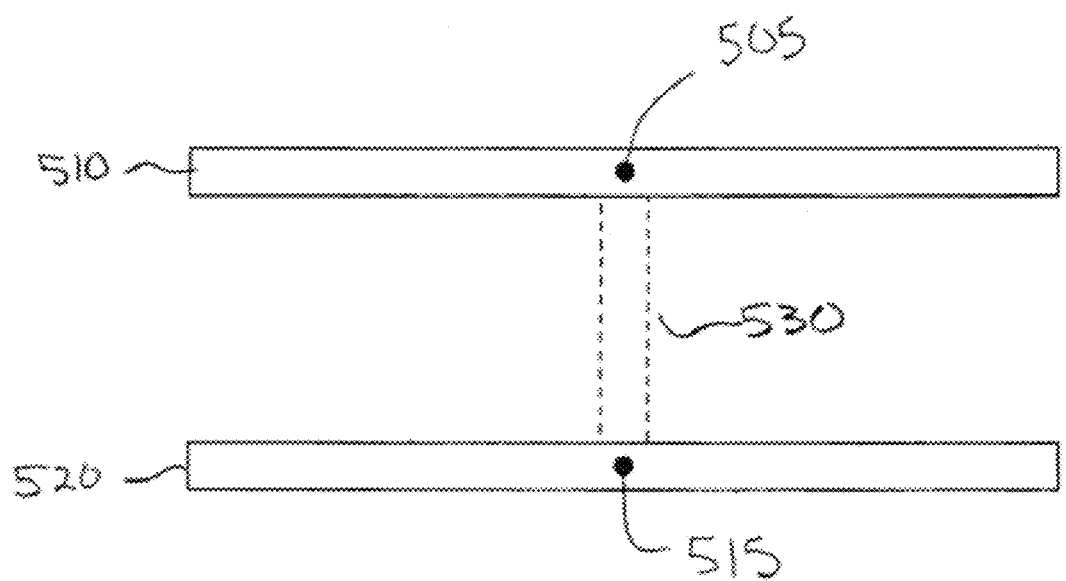
FIG. 5 diagrammatically illustrates exemplary spatial positioning relationships produced by the present invention.
Figure 6:
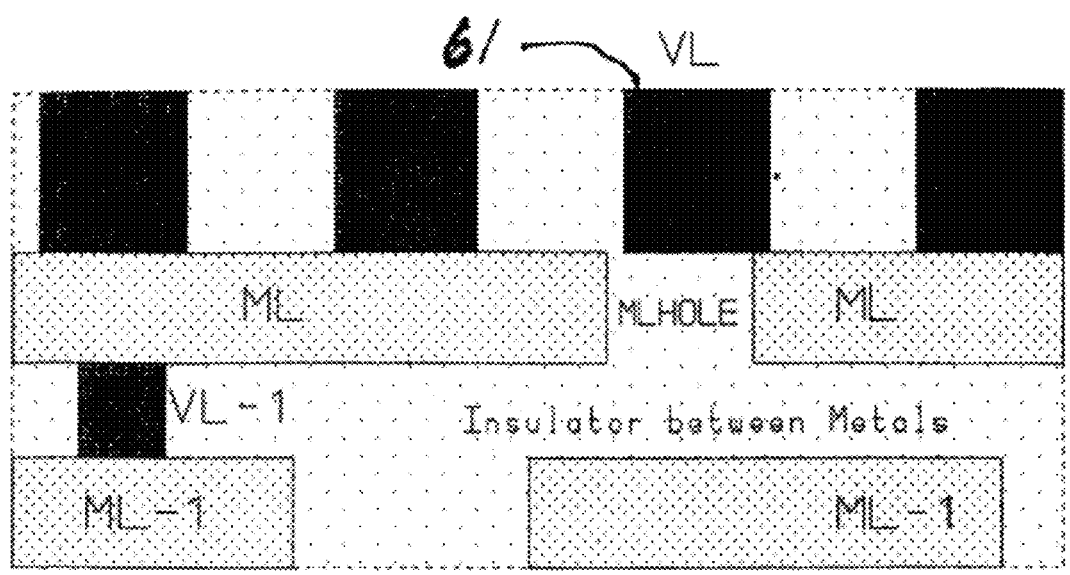
FIG. 6 illustrates a via punch-through problem in conventional integrated circuits.

In the exemplary embodiments of FIGS. 2 and 3, each of which was mutated from an exemplary redundant via array as described above, the black squares represent the VLs that were not mutated from the original array, the cross-hatched rectangles represent expanded VLs, and the white squares represent MLHOLEs. The exemplary embodiments of FIGS. 2 and 3 are based on a spacing rule of 0.1 μm between VLs and MLHOLEs. This spacing was based on the assumptions that the VL to MLHOLE misalignment is 0.07 μm and that the individual shape tolerance is 0.05 μm. When viewed from either side of the semiconductor architecture, the MLHOLEs of the exemplary embodiments of FIGS. 2 and 3 relatively overlie positions that were originally occupied by vias. FIG. 5 illustrates examples of the spatial relationship described by the phrase "relatively overlying." In FIG. 5, both point 505 and point 515 are in a relatively overlying relationship with the via array position formerly occupied by via 530 (shown in broken line), regardless of which of metal layers 510 and 520 is closest to the semiconductor substrate (not shown). In the exemplary embodiment of FIG. 2, 75% of the VLs in the original redundant via array have been mutated either to an expanded VL or to an MLHOLE. A sparser sample of VLs has been mutated either to an expanded VL or to an MLHOLE to achieve the exemplary embodiment of FIG. 3 and, in FIG. 3, a smaller fraction of the total mutations produce MLHOLEs than in FIG. 2. FIG. 4 tablularizes the exemplary embodiments of FIGS. 2 and 3. In FIGS. 2-4, the original redundant via array contained 900 VLs (a 30×30 array) and the area of the rectangle enclosing the region is 556.96 μm². In FIG. 4, the local hole density can be obtained by dividing the total MLHOLE area by 556.96 μm², for example (((0.8×0.8)×22−5)/556.96)×100=25.8%.

In some exemplary embodiments, MLHOLEs over VL−1 can also be removed. In some exemplary embodiments, with a spacing rule of, for example, 0.1 μm, mutation is applied to only those redundant VLs with spacing <=0.6 μm. In the latter exemplary embodiments, for spacing greater than 0.6 μm, new MLHOLEs can be freely inserted between redundant VLs without mutation. Since mutation introduces changes in shape count and shape size, the layout design data volume may grow by a factor of approximately 2×. For other devices, such as a field programmable gate array ("FPGA"), the data volume may decrease because the original MLHOLEs are relatively flat. In some exemplary embodiments, such as those used in FPGAs, the processing includes the mutation of closely-spaced VLs, the generation of new holes between VLs more widely-spaced, and the removal of MLHOLEs contacting VL−1 or close to a VL.

Exemplary embodiments of the present invention can be included in redundant via generation routines to pre-generate the larger holes. Standard cheesing operations can then follow to complete the hole generation outside regions of dense redundant vias. The VL to MLHOLE spacing rule conventionally used in standard cheesing routines can be modified to match the spacing rule used in the mutation process (e.g., 0.1 μm).

It should be clear from the foregoing that intersecting vias and holes on levels other than the last ("Vi" and "MiHOLE") can also be mutated and/or expanded in accordance with exemplary embodiments of the present invention.

Although exemplary embodiments of the present invention have been described in detail, it will be understood by those skilled in the art that various modifications can be made therein without departing from the spirit and scope of the invention as set forth in the appended claims.

The invention claimed is:

1. A semiconductor interconnect architecture, the architecture comprising:
   a first metal layer having provided therein a plurality of holes;
   a second metal layer;
   a plurality of conductive vias interconnecting said first and second metal layers, said plurality of conductive vias comprising a set of redundant vias;
   wherein said plurality of holes are located within said first metal layer respectively corresponding predetermined positions relative to respective vias of said set of redundant vias; and
   wherein the set of said redundant vias have been mutated into a plurality of holes in said first metal layer.

2. The semiconductor interconnect architecture of claim 1, wherein some of said plurality of vias have a first cross-sectional area and others of said plurality of vias have a second cross-sectional area that differs from said first cross-sectional area.

3. The semiconductor interconnect architecture of claim 2, wherein some of said holes have a cross-sectional area that is greater than a cross-sectional area of some of said vias.

4. The semiconductor interconnect architecture of claim 1, wherein some of said holes have a cross-sectional area that is greater than a cross-sectional area of some of said vias.

5. The semiconductor interconnect architecture of claim 1, wherein said holes are approximately equidistantly offset from respective points in the first metal layer that are in a relatively overlying relationship with the corresponding vias of said set of redundant vias.

6. The semiconductor interconnect architecture of claim 1, wherein a first subset of said plurality of holes are located between redundant vias that have a spacing that is greater than a predetermined spacing distance.

7. The semiconductor interconnect architecture of claim 6, wherein a second subset of the said plurality of holes correspond to a location of redundant vias that have a spacing that is less than or equal to a predetermined spacing distance.

8. The semiconductor interconnect architecture of claim 7, wherein said predetermined spacing distance is approximately 0.6 μm.

* * * * *